United States Patent [19]

Cricchi et al.

[11] 4,149,270
[45] Apr. 10, 1979

[54] VARIABLE THRESHOLD DEVICE MEMORY CIRCUIT HAVING AUTOMATIC REFRESH FEATURE

[75] Inventors: James R. Cricchi, Catonsville, Md.; Boyce T. Ahlport, Rolling Hills Estates, Calif.

[73] Assignees: Westinghouse Electric Corp., Pittsburgh, Pa.; Northrop Corporation, Los Angeles, Calif.

[21] Appl. No.: 836,332

[22] Filed: Sep. 26, 1977

[51] Int. Cl.² .................. G11C 7/00; G11C 11/40
[52] U.S. Cl. .................................. 365/222; 365/184
[58] Field of Search ............... 365/222, 184, 185, 189

[56] References Cited

U.S. PATENT DOCUMENTS

| 3,801,965 | 4/1974 | Keller et al. | 365/189 |
| 3,836,894 | 9/1974 | Cricchi | 365/222 |
| 4,037,243 | 7/1977 | Hoffman et al. | 365/222 |
| 4,044,343 | 8/1977 | Uchida | 365/184 |
| 4,055,837 | 10/1977 | Stein et al. | 365/222 |

Primary Examiner—Stuart N. Hecker
Attorney, Agent, or Firm—H. W. Patterson

[57] ABSTRACT

An MNOS non-volatile memory circuit, which inhibits the application of a write voltage to a memory cell at times when the write data is the same as the data stored in such cell to prevent saturation of the transistor, includes provision for applying automatically such a write voltage upon the detection of a predetermined weak storage condition in such cell.

5 Claims, 3 Drawing Figures

| DATA STORED | DIW | $I_{20}$ | $I_{T1}$ | $I_{21}$ | $I_{T2}$ | STATE DETECTED | COMPARATOR DECISION |
|---|---|---|---|---|---|---|---|
| 1 | 1 | 100 | 0 | 10 | 50 | 1 | INHIBIT REWRITE |
| 1 | 1 | 30 | 0 | 20 | 50 | 0 | REWRITE 1 |
| 1 | 0 | 100 | 50 | 10 | 0 | 1 | WRITE 0 |
| 1 | 0 | 30 | 50 | 20 | 0 | 1 | WRITE 0 |
| 0 | 0 | 10 | 50 | 100 | 0 | 0 | INHIBIT REWRITE |
| 0 | 0 | 20 | 50 | 30 | 0 | 1 | REWRITE 0 |
| 0 | 1 | 10 | 0 | 100 | 50 | 0 | WRITE 1 |
| 0 | 1 | 20 | 0 | 30 | 50 | 0 | WRITE 1 |

VARIABLE THRESHOLD DEVICE MEMORY CIRCUIT HAVING AUTOMATIC REFRESH FEATURE

GOVERNMENT CONTRACT

The invention herein described was made in the course of or under a contract or subcontract No. FO4704-75-C-006 thereunder with the Department of the Air Force.

BACKGROUND OF THE INVENTION

In memory circuits utilizing variable threshold devices, such as MNOS transitors, the threshold value at which the transistor conducts may be controlled to have a low threshold level for supplying a logic or binary "one"; and to have a high threshold level fro supplying a logic or binary "zero", for example. In such circuits, it is desirable to have a short write cycle time to enable fast writing of data into the memory cell as well as reading such data out. In a prior art MNOS memory circuit, data may be written into the memory cell over and over. In other words, the memory cell may be written as a binary one for a number of times in a row before a binary zero is written. This causes the variable threshold transistor to shift its threshold between high and low to the maximum extent during the write cycle which saturates the device to a condition. which may be referred to as the saturated threshold state. Thus, when it is desired to write a binary level of the opposite state into the memory cell, the write pulse must have adequate polarizing voltage and time to shift the threshold voltage of the transistor from the previous saturated state. To speed up the time of writing a binary level or shifting the voltage in a variable threshold transistor, such as an MNOS transistor, the voltage or electric field across the gate insulator of the device is increased by increasing the polarization voltage. Unfortunately, these high electric fields across the gate insulator of the MNOS device during the write cycle serve to accelerate the undesirable endurance phenomena creating a smaller threshold voltage and decreased retention time of the memory state.

In an attempt to prevent saturation of the transistor, one typical prior art circuit operated such that the transistor was cleared prior to each writing of the transistor to a high threshold state. Such clearing consisted of applying a voltage to obtain a low threshold state prior to each writing of the data, regardless of the data already in the memory cell. This was followed by applying the voltage for the high threshold state to selected memory cells. Such a system, which required the application of a write voltage first for logical zeroes, and then for logical ones, required more than twice the minimum write time.

In order to overcome the disadvantages of operation created by the saturated threshold state without increasing the polarization voltage or without requiring that each cell be operated to its low threshold state prior to selectively operating the memory cells to the high threshold state during each write cycle, a system and method described in U.S. Pat. No. 4,090,258, dated May 16, 1978 and issued to J. R. Cricchi, one of the inventors of the present application, is proposed. This system describes a variable threshold MNOS non-volatile memory system and method that utilizes a pair of MNOS transistors for each memory cell. For a binary one, one transistor is operated to its high threshold state, while the other transistor is simultaneously operated to its low threshold state. For a binary zero, the one transistor is operated to its low threshold state while the other transistor is operated to its high threshold state. Prior to each write cycle of the circuit, a read-compare operation is performed, which compares the data to be written with the data actually stored in the memory cell. In the event that the data stored in the memory cell is the same as the data to be written into that memory cell, the write portion of the cycle is inhibited. This inhibiting of the rewriting of the same data into the memory cell prevents the transistor from being operated to its saturation threshold state without the necessity of clearing the transistor prior to the writing in of each new data. Further, in such system the fact that one of the transistors of the cell is operated to its low threshold state and the other to its high threshold state increases the "window" to minimize the errors when reading out the data stored in the memory cell.

However, MNOS memories that have fast write characteristics tend to have short retention periods. Although the proposed system provides for a large window, it is possible that certain memory cell remain in their binary one or binary zero state during extended operations that the detection window would decrease; that is, the high threshold state of one of the transistors of the memory cell would decrease and the low threshold state of the other transistor of the memory cell would increase. Although such a system provided accuracy of operation down to a one-half volt difference between the two transistors of a memory cell, it is desirable that the transistors be refreshed periodically without driving the transistors to their saturated threshold state. Also, it is desirable that the refreshing of the memory cells be controlled internal to the memory array rather than by external programming.

SUMMARY OF THE INVENTION

The present invention relates to a temporary store memory circuit which utilizes variable threshold semiconductor devices for the memory cells. Prior to the time for writing new data in the memory cell, the circuit provides for comparing such data to be written with the data stored in the cell; and includes means to inhibit during the write cycle, the rewriting of the same data as that already stored in the memory cell when the threshold levels of the semiconductor devices are in a predetermined non-marginal state together with means for rewriting the same data in the memory cell when the threshold levels are in a predetermined marginal state. Thus, both threshold saturation and degradation of the proper threshold levels for the semiconductor devices is prevented.

More specifically, the memory circuit includes a pair of MNOS devices for each memory cell. One of the pairs is in its low threshold state and the other is in its high threshold state for providing a binary one; and in their opposite threshold states to provide a binary zero. The detection circuit senses which transistor of the memory cell is first to conduct to determine the data stored in such cell. A comparison circuit compares the detected stored data with the data to be written in the cell prior to each actual writing. In the event that the stored data is the same as the data to be written, such writing is inhibited.

The system includes an additional network which controls current flow into the detection circuit as a function of data input. If the memory device is in a marginal threshold state, the current flow causes a state opposite to that previously stored to be detected. The comparison circuit then detects the data as being different from that previously stored resulting in a rewriting of data into the cell, which refreshes the threshold level. When the memory device is in a non-marginal state, current added to the detection circuit input does not influence the state detected, but reduces the read time, thus decreasing the write cycle time.

DESCRIPTION OF THE PREFERRED EMBODIMENT

Figures 1, 2:
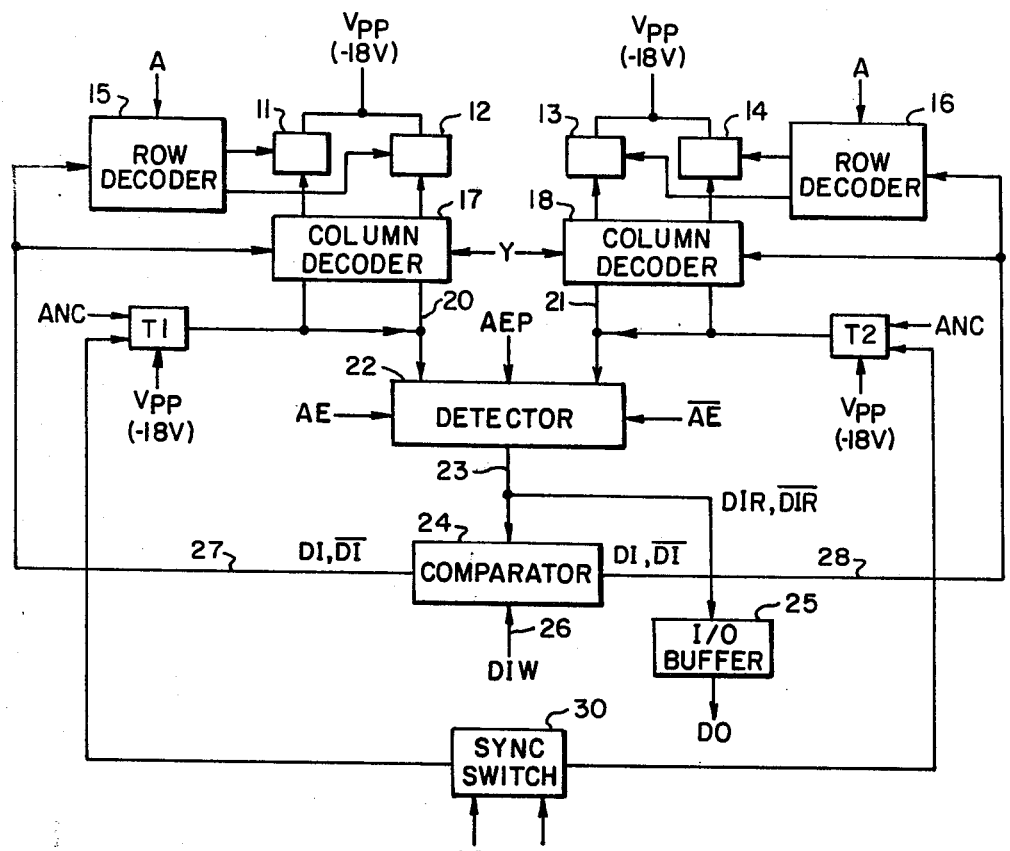
FIG. 1 is a schematic block diagram of a system according to one embodiment of the present invention.
FIG. 2 is a table illustrating the operation of the device for strong and weak threshold levels of the transistors of a typical memory cell.

Referring to FIG. 1, a block diagram of a random access memory is illustrated utilizing the improvement of the present invention. For simplicity of description, the memory is shown as an array having a single row and two columns. The single row is comprised of memory transistors 11, 12, 13 and 14. Each memory cell is made up of two MNOS transistors. One of the cells is comprised of the transistors 11 and 13 and the other cell is comprised of the transistors 12 and 14. Thus, one of the columns is comprised of the transistors 11 and 13 and the second column is comprised of the transistors 12 and 14. The memory portion of the system is so organized that for storing a binary one, for example, in one of the columns the transistor 11 is in its high threshold state and the transistor 13 is in its low threshold state, for example. Similarly, the one cell which comprises the second column, has its transistor 12 in one threshold state and its transistor 14 in the opposite threshold state for storing a binary one or a zero, as the case may be. Each of the memory transistors 11 through 14 is a variable threshold device, preferably of the type referred to as an MNOS transistor described in more detail in U.S. Pat. No. 3,836,894, issued on Sept. 17, 1974 and entitled "MNOS/SOS Random Access Memory". Although only a single row and two columns of memory cells are illustrated, it is understood, that in actual practice, each such array might provide thirty-two rows and eight columns for storing 256 bits, for example. Address signals generally referred to as A are input to row decoders 15 and 16 for selecting a particular row of the memory array. As shown in FIG. 1, the row decoder 15 selects the portion of the row comprising transistors 11 and 12; and the row decoder 16 selects the portion of the row comprised of transistors 13 and 14. Similarly, column decoders 17 and 18 select the particular column address. The column decoder 17 selects the column that comprises either the transistor 11 or the transistor 12, while the column decoder 18 selects the corresponding address for the transistors 13 or 14. Thus, the column decoders 17 and 18 cooperate to select the memory cell comprised of the transistors 11 and 13 or the memory cell comprised of the transistors 12 and 14. The state of the selected memory cell is output over lines 20 and 21 from the column decoders 17 and 18 to the input of a detector 22. For example, assuming that the memory cell comprised of transistors 11 and 13 corresponds to the selected address, the stored state of each such transistor is sensed in accordance with the conductance of the lines 20 and 21, respectively. For example, if the transistor 11 is in its high threshold state and the transistor 13 is in its low threshold state, the current on the output 21 reaches a higher value more rapidly than the current at the output 20 of the decoder 17.

The detector 22 may be a bistable, multivibrator that is normally in a neutral position. However, when such detector senses the current in the inputs 20 and 21, it operates to a condition corresponding to the stored state of the transistors of the associated selected memory cell. The state of such memory cell is output over line 23 of the detector 22 to a write comparator 24. Such output, which may be referred to as $\overline{DIR}$ or its complement DIR is also output to an input-output buffer 25 for supplying the information for the normal function of the memory system. The data to be written into the selected memory cell is input to the comparator 24 over line 26; and is referred to as a DIW input. The data DIW is compared with the data DIR or its complement on line 23 for determining whether to write the data DIW into the selected memory cell or to inhibit such rewriting if the data stored in the memory cell is the same as the data to be written therein. In the event that the data to be written on input 26 is different than the data stored in the selected memory cell as sensed at output line 23 of the detector then the individual selected transistors will be written to their high or low threshold states over lines 27 and 28. In the event that the input DIR is the same as the data to be written DIW, the comparator operates to inhibit the rewriting of the same threshold state into the selected transistors of the memory cell.

In the operation of the memory system, the various input signals are applied in a predetermined timing sequence to accomplish the read and the write cycles. During the read cycle, the data input voltage DI and its complement $\overline{DI}$ are both at 12 volts, for example. This prevents or inhibits the changing of the stored logic in the memory cells (11, 13) and (12, 14). An address enable signal AE and its complement $\overline{AE}$ is applied to the row decoders 15 and 16, and the column decoders 17 and 18 to enable the selection of the address by the appropriate signals A and Y in a conventional manner. The write cycle may be considered to have two portions, the first portion is the read-compare portion and the second portion is the actual writing of the data into the memory. During the read-compare portion, the write input data DIW is first compared with the stored data DIR for the selected memory cell. If the write data DIW is the same as the stored data DIR, then the writing of the data is inhibited such as by maintaining the value DI and its complement DI both at 12 volts, as previously mentioned. For a more detailed description of the temporary store memory which includes the write inhibit feature as previously described, reference is made to copending U.S. patent application Ser. No. 755,280 now U.S. Pat. No. 4,090,258, "Improved MNOS Non-volatile Memory" and filed Dec. 29, 1976 by J. R. Cricchi and assigned to a common assignee, which application is hereby incorporated by reference.

Assuming that the memory cell comprised of the transistors 11 and 13 is addressed, the transistors 11 will discharge a voltage on line 20 and the transistor 13 will discharge a voltage on line 21. Because of the difference in threshold voltages between the transistors 11 and 13, there is a variation in the conductivity of the transistors relative to each other. One of the transistors will conduct considerably more current than the other. The transistor with the low threshold state having a typical threshold of -4 volts conducts a greater current than the transistor in the high threshold state which has a typical threshold voltage of -7 volts, for example. As will be described in more detail, the detector 22 detects the relative conductivity of each of the transistors of the memory cell input on lines 20 and 21 to determine the binary state of such cell. Assuming that the memory cell is storing a binary one, the transistor 11 is in a low threshold state, more current will appear on the line 20 than appears on the line 21 with the transistor 13 in its high threshold state. With the transistor 11 in its low threshold state and high conductance on the line 20 at the same time that the transistor 13 is in its high threshold state with low conductance on the line 21, the cell is described as being in a binary one state. When the conductance on the line 20 is lower than the line 21 indicating a reverse threshold state of the transistors of the selected memory cell, the cell is said to be in a binary zero state. In the event that the memory is operated such that the transistors are not operated to their opposite threshold states for changin the binary information stored therein, such threshold states tend to degrade which in effect decreases the amount of current on the line 20 when the transistor is in a low threshold state and increases the current on the line 21 for a transistor that is in the high threshold state. Thus, the "window" or difference between the states of the two transistors of the memory cell tends to decrease. This of course tends to slow up the speed of the read operation of the memory circuit and may at times cause a faulty storage indication. A current source referred to as ANC of FIG. 1 is applied to the line 20 through a switching circuit T1, and applied to the line 21 through a switching circuit T2. This current is applied in such a way that the transistors of the selected memory cell during the read-compare mode will be refreshed or rewritten to the proper threshold states even though such rewriting is normally inhibited. This automatic refreshing or rewriting occurs only when the "window" decreases by a predetermined amount by either the line drawing the low current increasing or by the line drawing the high current decreasing. A synchronizing switch 30 which is controlled by the input data DI and the write control W operates the switches T1 and T2 in a manner such that a predetermined additional current is applied to that input of the detector 22 which corresponds to the transistor of the memory cell conducting the least current at times when the data to be written is the same as the data to be stored. Although it is not absolutely necessary to accomplish the automatic refreshment in accordance with the present invention, the described embodiment is so constituted that an additional current is also applied to that input of the detector 20 or 21 corresponding to the transistor of the selected memory cell which conducts the greatest amount of current at times when the data to be written is different than the data to be stored. This of course is desirable in that it aids in the certainty and speed of detection and operation of the system.

In describing the operation of the system and with reference to the table of FIG. 2, it will be assumed that when a transistor of a memory cell has a proper low threshold value that the current at the input of the detector 22 will be one hundred units. When a transistor has the proper high threshold value, its corresponding input 20 or 21 to the decoder 22 is assumed to have ten units of current. It is further assumed, for the sake of simplicity of description, that the current ANC supplied through the switches T1 and T2 amounts to 50 units of current. It is understood of course that the conductance of the input lines 20 and 21 and the amount of current applied may differ proportionately. If the data stored in the memory cell is a binary one and the data to be written is also a binary one with the threshold values at their normal level, the additional current will be supplied through the switch T2 to the line 21 which is conducting ten units of current. Since the current conducted on the line 20 is one hundred units, the addition of fifty units to the ten units conducting on line 21 still provides an input to the detector 22 where the current on the line 20 is greater than that on the line 21 and therefore the rewriting of the data into the transistors of the memory cell is inhibited. However, if the threshold value of the selected transistor for the input line 20 changes such that the units of current decrease from one hundred to thirty, for example, and the current on the line 21 increases to twenty units, a marginal condition for example; then the additional current on line 21 from T2 causes the line 21 to have a greater current thereon than the line 20 which will cause the device to rewrite a binary one into the transistors after the read-compare mode. In effect, a zero state is detected by the circuitry instead of the actual state stored in the memory cell. In the event that the data stored in the cell is a binary one and the data to be written is a binary zero, the additional fifty units of current is supplied to the one hundred units of current on line 20 which increases the difference between the conductors 20 and 21 from ninety units to one hundred forth units and merely causes the device to write a zero into the transistors in accordance with the input data. Such is the case, of course, regardless of the relative threshold values of the two transistors of the memory cell. From the preceding description and an inspection of the table of FIG. 2, the other conditions which occur in the operation of the circuit are readily understood. The current ANC may be adjusted to cause a refreshing or a rewriting of the transistor for any predetermined window degradation. For example, if the fifty units to be added as given in the example were increased to sixty units, then the system will rewrite the same data stored in the transistors more often than if the additional current ANC were decreased to forty units, for example.

Figure 3:
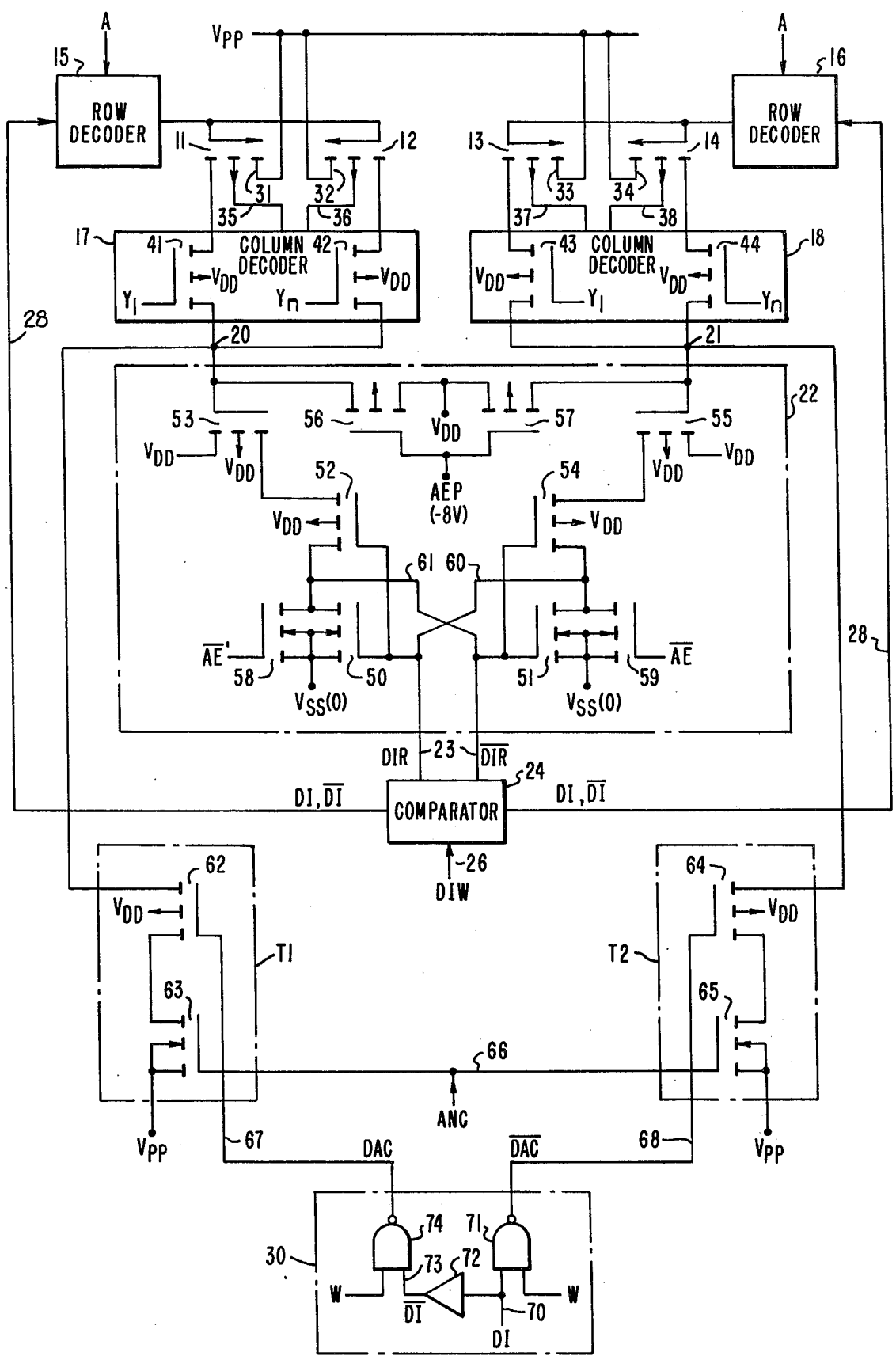
FIG. 3 is a more detailed schematic diagram of the system of FIG. 1.

Referring to FIG. 3, the portions of the circuit within the dashed lines as well as other common components of the circuit bear the same references characters as the similar blocks of FIG. 1. The memory transistors 11, 12, 13 and 14 are preferably p-channel enhancement mode transistors, each having a gate drain, source and substrate body. The gate dielectric provides a variable threshold characteristic; and may be, for example, a layer of silicon nitride over a layer of silicon dioxide. Drains 31 through 34 of the memory transistors and coupled to a voltage supply $V_{pp}$ which may be $-18$ volts for example. Substrate bodies of each of the transistors are coupled over lines 35 through 38 to the column decoders 17 and 18 respectively. The source 40 of the transistor 11 is connected through transistor 41 to provide the input to the decoder 22 over line 20. Similarly, the source of the transistor 12 is also connected to the input 20 of the detector 22 through a transistor 42 in the column decoder 17. The transistors 13 and 14 are coupled to the input 21 of the detector 22 through transistors 43 and 44 of the column decoder 18. The column decoders 17 and 18 each function to precharge the source and substrate body of their associated memory transistors. Also, the decoder selects a particular memory cell column during the read or write operation. Thus, when the transistors 41 and 43 or 42 and 44 are conducting, the current on the source of its coupled transistor 11 through 14 is sensed at its associated input 20 and 21 to the detector 22. As previously mentioned, the detector 22 functions to detect which of the input lines 20 or 21 has the highest conductance.

The detector 22 is comprised of cross-coupled transistors 50 and 51 which latch when the gate voltage of one of the transistors is low enough to turn its associated transistor towards the conductive state. The gate of the transistor 50 is connected to the gate of a transistor 52 whose drain is supplied by current from the drain of a transistor 53, the gate of which is connected to the input line 20. Similarly, the gate of the transistor 51 is connected to the gate of a transistor 54, the drain of which is connected to the drain of a transistor 55, having a gate connected to the input line 21. At the beginning of the read cycle, a voltage source AEP is applied to gates of transistors 56 and 57, the sources of which are commonly connected to the voltage supply $V_{DD}$, which voltage may be $V_{DD} = +12$ volts, from example. The substrate body of the transistors 52, through 55 as well as the sources of the transistors 53 and 55 are connected to the voltage supply $V_{DD}$. When the input AEP is at $-8$ volts, the transistors 50 and 51 conduct which couples the voltage supply $V_{DD}$ to the input lines 20 and 21. In a typical read cycle, the signal AEP next goes to $+12$ volts, for example, which causes the transistors 50 and 51 to go to a non-conducting state. At the beginning of the read cycle, the signal $\overline{AE}$ goes to $+12$ volts which causes the transistors 58 and 59 to conduct and reset lines 60 and 61 to $V_{SS}=0V$. When AEP goes to $+12$ V, $\overline{AE}$ goes to $V_{SS}=0$ volts and transistors 58 and 59 are turned off. Thus, the transistors of the selected memory cell such as 11 and 13 for example cause either the latching transistor 50 or 51 to conduct depending upon the threshold state of the particular transistor. The transistor 50 or 51, which is the first to conduct, prevents the other transistor from conducting due to the charging current from the voltage supply $V_{DD}$ which is connected to the substrate of the transistors 52 through 55. Such voltage is connected to the gate of the other transistor over lines 60 and 61 respectively. Thus, for a situation where the memory cell is read as a binary one, the current on line 20 is greater than the current on line 21. since 52 and 54 are both initially on and the transistor 53 is first to conduct which in turn allows the transistor 51 to conduct thus providing a binary one to the output $\overline{DIR}$ of the line 61 and a binary zero on the output DIR of the line 60. Also, a similar binary output occurs on the lines 28 for the input DIR and its complement $\overline{DIR}$ to the comparator 24. As previously mentioned, previous to writing data into the selected memory cell, the data stored therein an indicated on the line 23 to the comparator 24 is compared. The details of such comparator are disclosed in the above-referenced U.S. copending patent application. As previously mentioned, if the data DIW compares with the data DIR, the actual writing of the data or rewriting of the data into the memory cell in inhibited provided that the values on the lines 20 and 21 are the predetermined difference. One manner of preventing the polarization voltages from occurring across the gate insulators of the transistors of the selected memory cell is to hold the data signals DI and $\overline{DI}$ to $+12$ volts during the write cycle. If the read data does not compare with the write data, then the write data will be present on DI and its complement on $\overline{DI}$.

The gates or switches T1 each comprises a pair of transistors for applying the refresh bias current set by voltage ANC to the inputs 20 and 21 respectively. The gate T1 includes a P channel transistor 62 and an N transistor 63 with the drain of the transistor 63 being connected to the source of the transistor 62. The drain of the transistor 62 is connected to the line 20. Similarly, the gate T2 includes transistors 64 and 65, which are connected in the same manner as the transistor 62 and 63 except that the drain of the transistor 64 is connected to the input line 21. The substrate of the transistor 62 is connected to the voltage supply $V_{DD}$ to balance leakage currents and junction capacitance; while the substrate and source of the N channel transistor 63 is connected to the voltage supply $V_{PP}$ in order to reduce substrate bias effects. The transistors 64 and 65 of the gate T2 are similarly connected. The voltage ANC is connected to both of the gates T1 and T2 over line 66 to the respective gates of the transistors 63 and 65. The gate of the transistors 62 and 64 of the respective gates T1 and T2 are input over lines 67 and 68 respectively to the synchronous switching means 30. The functions of the switch 30 is to cause the transistor 62 or 64 to conduct at the precise time in order to automatically refresh the selected memory transistors as described in connection with FIGS. 1 and 2. When the data input DI is high on line 70 to the input of a NAND gate 71, then its complement which is conducted through an inverter 72 is low on line 73 to the input of a NAND gate 74. The other input to the NAND gate W is active at times when writing but not in the read mode. Thus, a signal DAC and its complement $\overline{DAC}$ are in opposite high or low states depending upon whether the input signal DI is either high or low. When the output from the gate 74 on line 67 is high, the transistor 62 is in a non-conducting state which prevents the current controlled by ANC from being applied to the input line 20. At this time however the output of the NAND gate 71 is low, which causes the transistor 64 of the gate T2 to conduct which applies the added current through 65 controlled by ANC to the input 21. Therefore, the current will always be applied to sense the transistor having the high threshold state or in other words a low current on its input 20 or 21 when the binary information stored in the memory cell is the same as that corresponding to the data to be written. When the information stored is different, the switch 30 of course operates in the same manner, but the current will be applied to the input 20 or 21 for a memory transistor that has a higher current applied to such inputs or in other words the low threshold transistor.

In summary, there has been described an improved temporary store memory circuit having provision for automatically refreshing the threshold of the memory transistors when such thresholds have degraded to a predetermined value. The system utilizes the read/compare operation and includes an additional network which controls current flow into the memory detection circuit as a function of data input. If the memory device is in a marginal threshold state, current added to the column detection circuit at 20 or 21 will cause a state opposite to that previously stored to be detected; that is, although a binary one was stored, a binary zero is detected. (See FIG. 2) Since the comparator 24 in the temporary store memory provides a command to write the data input if the data input is not equal to the data detected, then the binary one previously stored will be rewritten, or in other words the threshold will be refreshed. If the memory device is in a non-marginal stored state, current added to the column detection circuit does not influence the state detected. Since the comparator in the temporary store memory provides a "write inhibit" command if the data input is equal to the data detected, no rewriting occurs when the memory device has a predetermined strong binary one stored therein.

What we claim is:

1. A temporary store memory circuit having a plurality of variable threshold level semiconductor memory cells, said circuit comprising:

first means to apply a polarization voltage to selected semiconductor cells to vary the threshold level at times when the data stored and the data to be stored in such cells are different;

second means to sense the threshold level of a selected semiconductor memory cell; and third means governed by the second means to apply the effective polarization voltage in accordance with a predetermined sensed threshold level at times when the threshold level is in a predetermined marginal state and the data stored and the data to be stored in such cells are the same.

2. A circuit according to claim 1 wherein the second means includes means to sense conductance that varies inversely as a function of the threshold level of the selected device; and the third means includes means to change the sensed conductance by a predetermined value, and includes means responsive to the sensed and predetermined conductance value to apply the polarizing voltage at times when the threshold level is below a predetermined level.

3. A temporary store memory circuit having a pair of variable threshold semiconductor devices for each memory cell, said circuit comprising:

first means to apply a polarization voltage to each of the devices of a cell for operating the devices of a cell selectively to opposite low level and high level threshold states at times when the data stored and the data to be stored in the cells are different;

second means governed by the relative threshold levels of the pair of devices to detect the data stored in the cell;

third means governed by the second means to apply the effective polarization voltage in accordance with the relative threshold levels at times when the threshold levels are in a predetermined marginal state and the data stored and the data to be stored in such cell is the same.

4. A memory circuit having a pair of variable threshold semiconductor devices for each memory cell, said circuit comprising:

writing means for operating one device of each pair to a low threshold state and the other device of each pair to a high threshold state and vice versa to apply a polarizing voltage store selectively a binary one or a binary zero in each cell at times when the stored data is of the opposite state;

each said device including an output for conducting a signal having a value representative of the threshold value of its associated device;

detection means responsive to the relative values of the output signals of each pair of devices to generate a signal indicative of the binary data stored in each cell;

inhibit means governed by the detection means signal to render the writing mean ineffective at times when the binary data to be written is the same as the binary data stored in each cell; and threshold level refreshing means governed by the binary data to be written to change by a predetermined amount the value of the output signal representative of the threshold value of at least one of the devices of each pair, said predetermined amount being selected such that the detection means generates a signal indicative of binary data opposite to that stored in each cell at times when the relative threshold levels of the devices are less than a predetermined value to apply the polarizing voltage at times when the threshold level is in a predetermined marginal state and the binary data to be written on the binary data stored is the same.

5. A circuit according to claim 4 wherein the output of each semiconductor device is a current value representative of the threshold level of its associated device; and the refreshing means includes means to add a selected current value to the device output representative of a high threshold level.

* * * * *